United States Patent
Oh et al.

(10) Patent No.: US 7,977,016 B2
(45) Date of Patent: Jul. 12, 2011

(54) METHOD FOR FABRICATING EXTREME ULTRAVIOLET LITHOGRAPHY MASK

(75) Inventors: Sung Hyun Oh, Cheongju-si (KR); Yong Kyoo Choi, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 176 days.

(21) Appl. No.: 12/346,948

(22) Filed: Dec. 31, 2008

(65) Prior Publication Data

US 2009/0317728 A1    Dec. 24, 2009

(30) Foreign Application Priority Data

Jun. 20, 2008  (KR) ................. 10-2008-0058493

(51) Int. Cl.
*G03F 1/00* (2006.01)
*G03C 5/00* (2006.01)

(52) U.S. Cl. .................. 430/5; 430/311; 430/394
(58) Field of Classification Search .......... 430/5, 311, 430/394; 355/67; 205/492.2
See application file for complete search history.

(56) References Cited

U.S. PATENT DOCUMENTS

| | | | |
|---|---|---|---|
| 6,986,971 B2 | 1/2006 | Han et al. | |
| 7,282,307 B2 | 10/2007 | Hector et al. | |
| 7,326,502 B2 | 2/2008 | Silverman | |
| 7,629,596 B2* | 12/2009 | Taniguchi | 250/492.2 |
| 2001/0019802 A1* | 9/2001 | Nozaki et al. | 430/5 |
| 2008/0070128 A1* | 3/2008 | Wu et al. | 430/5 |
| 2009/0097004 A1* | 4/2009 | Trogisch et al. | 355/67 |

FOREIGN PATENT DOCUMENTS

| | | |
|---|---|---|
| CN | 101144973 A | 3/2008 |
| JP | 2008-070883 A | 3/2008 |
| KR | 10-2006-0055304 | 5/2006 |
| KR | 10-2007-0036519 | 4/2007 |

OTHER PUBLICATIONS

Lu et al., "Determining Relationship Between Electron-Beam Dose and Etching Depth by Empirical Formula of Contrast," *High Power Laser and Particle Beams*, 19(8):1377-1380 (2008).

* cited by examiner

*Primary Examiner* — Stephen Rosasco
*Assistant Examiner* — Rashid Alam
(74) *Attorney, Agent, or Firm* — Marshall, Gerstein & Borun LLP

(57) ABSTRACT

A method for fabricating an extreme ultraviolet (EUV) lithography mask comprises forming a reflecting layer, an absorber layer, and a resist layer over a substrate; defining a plurality of split regions by partially splitting the resist layer with regular spacing; performing an exposure process, wherein the exposure region is irradiated with an electron beam at different intensities on the split regions to generate a difference in electron beam doses implanted into the resist layer; forming a resist layer pattern which selectively exposes the absorber layer and has a slanted side wall profile by performing a development process to remove a portion of the resist layer, into which the electron beam doses are implanted; and forming an absorber layer pattern with a slanted side wall profile by sequentially etching the portion of the absorber layer exposed by the resist layer pattern.

8 Claims, 7 Drawing Sheets

METHOD FOR FABRICATING EXTREME ULTRAVIOLET LITHOGRAPHY MASK

CROSS-REFERENCE TO RELATED APPLICATION

Priority to Korean patent application number 10-2008-0058493 filed Jun. 20, 2008, the entire disclosure of which is incorporated by reference, is claimed.

BACKGROUND OF THE INVENTION

The invention relates generally to extreme ultraviolet (EUV) lithography and, more particularly, to a method for fabricating an EUV lithography mask.

As semiconductor devices become more highly integrated and the design rule decreases, pattern sizes required for semiconductor devices have become finer. On the other hand, the wavelength of light used in a photolithographic apparatus has become shorter and shorter, and a Numerical Aperture (NA) of the photolithographic apparatus has reached its limit. Accordingly, technologies have been developed to overcome a limit resolution for the pattern, for example, immersion lithography, Double Patterning Technology (DPT), and Extreme Ultraviolet (EUV) lithography.

The EUV lithography process uses EUV, the wavelength of which is shorter than KrF or ArF light, to form a pattern less than 32 nm. In a mask used in the EUV lithography, a reflecting layer in which MO/Si layers are repeatedly stacked is disposed on a substrate and an absorber pattern is disposed on the reflecting layer with a shape of the pattern to be transferred onto a wafer. When the EUV is irradiated on the EUV lithography mask, the EUV is absorbed at the absorber layer pattern and reflected at a surface of the reflecting layer.

The EUV irradiated in the EUV lithography process is irradiated or reflected with an angle of incidence inclined with respect to a mask surface, e.g. with an angle of incidence of 5° to 6°, rather than vertically. At this time, a height difference between the overlying absorber layer pattern and the underlying reflecting layer may cause a shadow portion at which the EUV is not irradiated or reflected. Therefore, the degree of shading by the absorber layer pattern is varied with the position on the wafer, resulting in a shadow effect in that a Critical Dimension (CD) of the wafer pattern is varied since a direction along which the EUV is incident to the mask is varied little by little as the position on the wafer to which the EUV is incident.

SUMMARY OF THE INVENTION

In one embodiment, a method for fabricating an extreme ultraviolet (EUV) lithography mask comprises forming a reflecting layer, an absorber layer, and a resist layer over a substrate; defining an exposure region on the resist layer; defining a plurality of split regions by partially splitting the exposure region with regular spacing; performing an exposure process by irradiating the exposure region with an electron beam using different intensities in the respective split regions to generate a difference in doses of the electron beam implanted into the resist layer; forming a resist layer pattern which selectively exposes the absorber layer by performing a development process for removing the portions of the resist layer into which the electron beam doses are implanted; and forming an absorber layer pattern by sequentially etching the portion of the absorber layer exposed by the resist layer pattern.

DESCRIPTION OF SPECIFIC EMBODIMENTS

Hereinafter, a method for fabricating an EUV lithography mask according to the invention will be described in detail with reference to the accompanying drawings.

Figure 1:
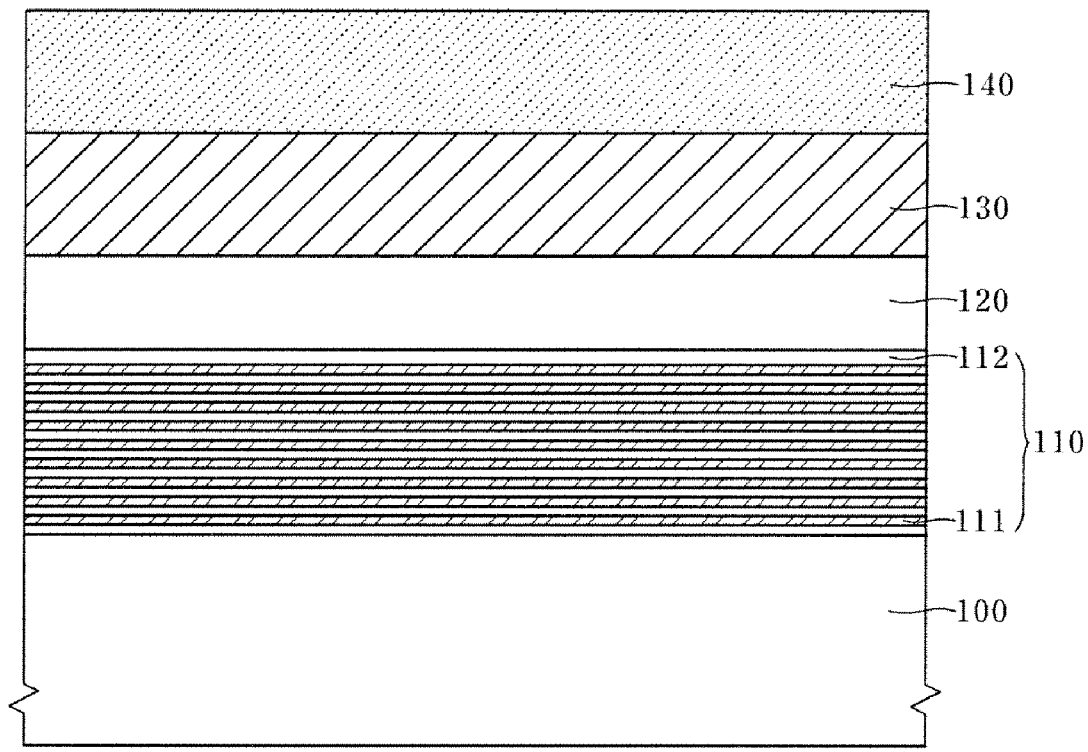
FIGS. 1 to 5 illustrate a process of fabricating an EUV lithography mask according to an embodiment of the invention.

Referring to FIG. 1, a reflecting layer 110 which reflects EUV light, a buffer layer 120, an absorber layer 130 and a resist layer 140 are formed over a transparent substrate 100. The transparent substrate 100 preferably comprises a quartz substrate having low thermal expansion coefficient. In order to allow the reflecting layer to reflect the EUV light with 13.4 nm wavelength irradiated to the mask, the reflecting layer 110 preferably comprises double layers of a molybdenum (Mo) layer 111 and a silicon (Si) layer 112 repeatedly stacked (e.g., 40 to 50 layers). At this time, the molybdenum layer 111 diffuses the EUV light irradiated to the mask, and the EUV light irradiated to the mask is reflected by the molybdenum layer 111 and the silicon layer 112 according to the Bragg reflection theory.

The buffer layer 120 protects the reflecting layer 110 during a modification process or an etching process for patterning the absorber layer 130. The absorber layer 130 preferably comprises a material capable of absorbing the EUV light, e.g. a TaBN layer and a TaBO layer.

Meanwhile, the uppermost layer of the molybdenum layer 111 and silicon layer 112 included in the reflecting layer 110 is preferably relatively thicker than the molybdenum layer 111 and silicon layer 112 repeatedly stacked therebelow. The uppermost layer preferably comprises a silicon layer 112 and acts as a capping layer for preventing oxidation or contamination of the reflecting layer.

Figure 2:
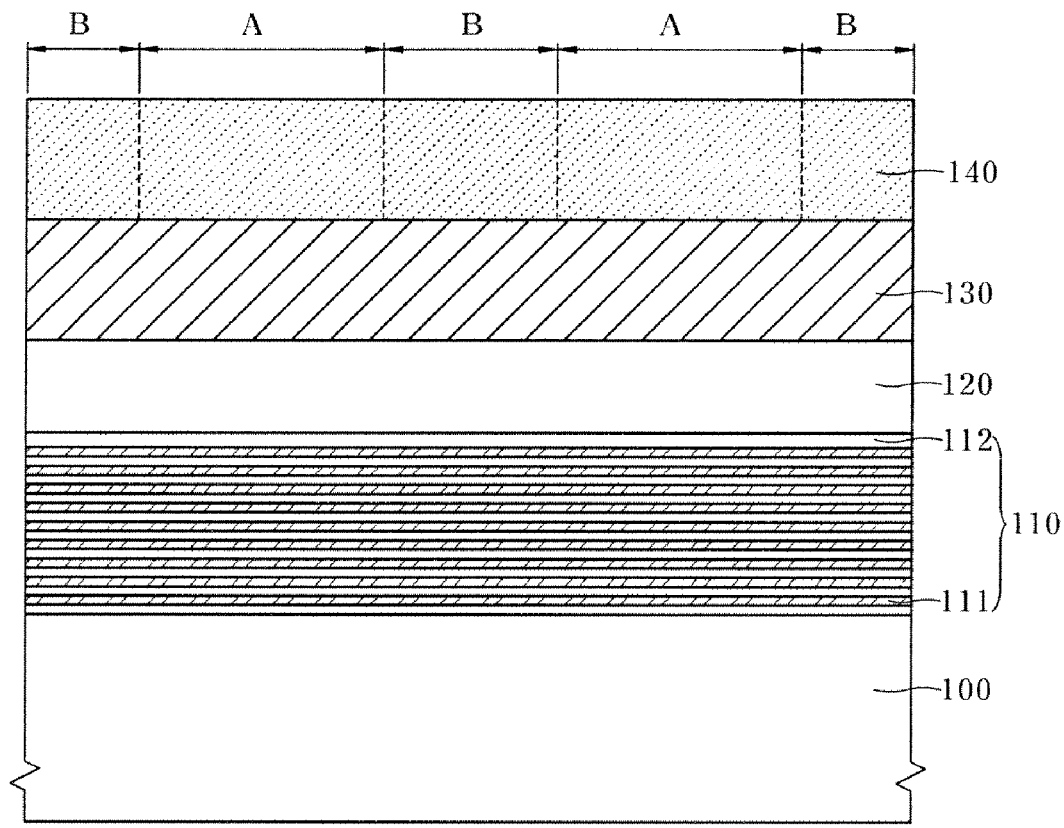

Referring to FIG. 2, a region to be subjected to an exposure process is defined in the resist layer 140 to distinguish exposure regions A and non-exposure regions B. The exposure region A refers to a region to which an electron beam is irradiated and in which the resist layer is removed by a developing solution to selectively expose the absorber layer 130. The non-exposure region B refers to a region in which the resist layer remain against exposure to the developing solution to selectively block the absorber layer.

Figure 3A:
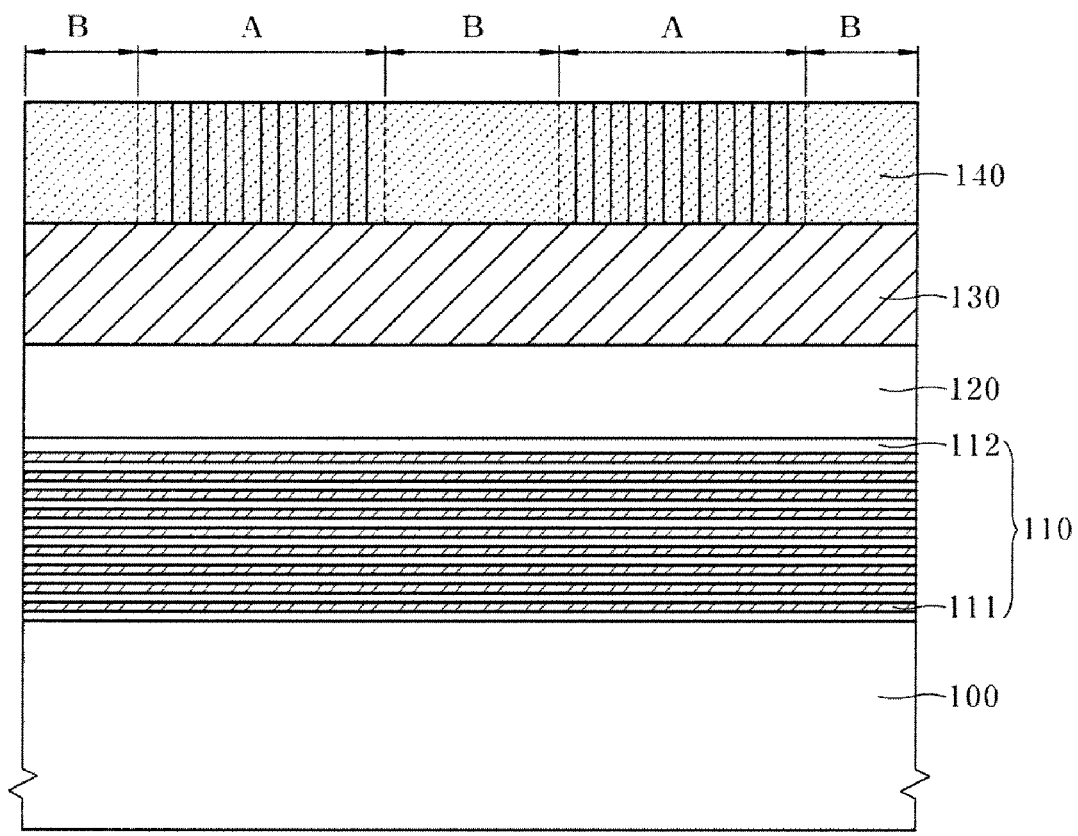

Referring to FIG. 3A, the exposure region A is split with a regular spacing to define a plurality of split regions and the electron beam is then irradiated to the split regions with different intensities by the split regions. The number of the split regions may be varied as the position of the exposure region A in the resist layer 140 corresponding to a wafer field region. The electron beam may be irradiated so that the intensity of the electron beam is increased from the boundary between the exposure region A and the non-exposure region B, i.e. outermost split region, to the central split region. In the exposure process, an electron beam dose implanted into the resist layer is varied as a function of the intensity of the electron beam. For example, the dose implanted into the resist layer is increased as the intensity of the electron beam is increased and the dose implanted into the resist layer is decreased as the intensity of the electron beam is decreased. Such difference in the dose implanted into the resist layer results in a difference in the thickness of the resist layer in the development process.

Figure 3B:
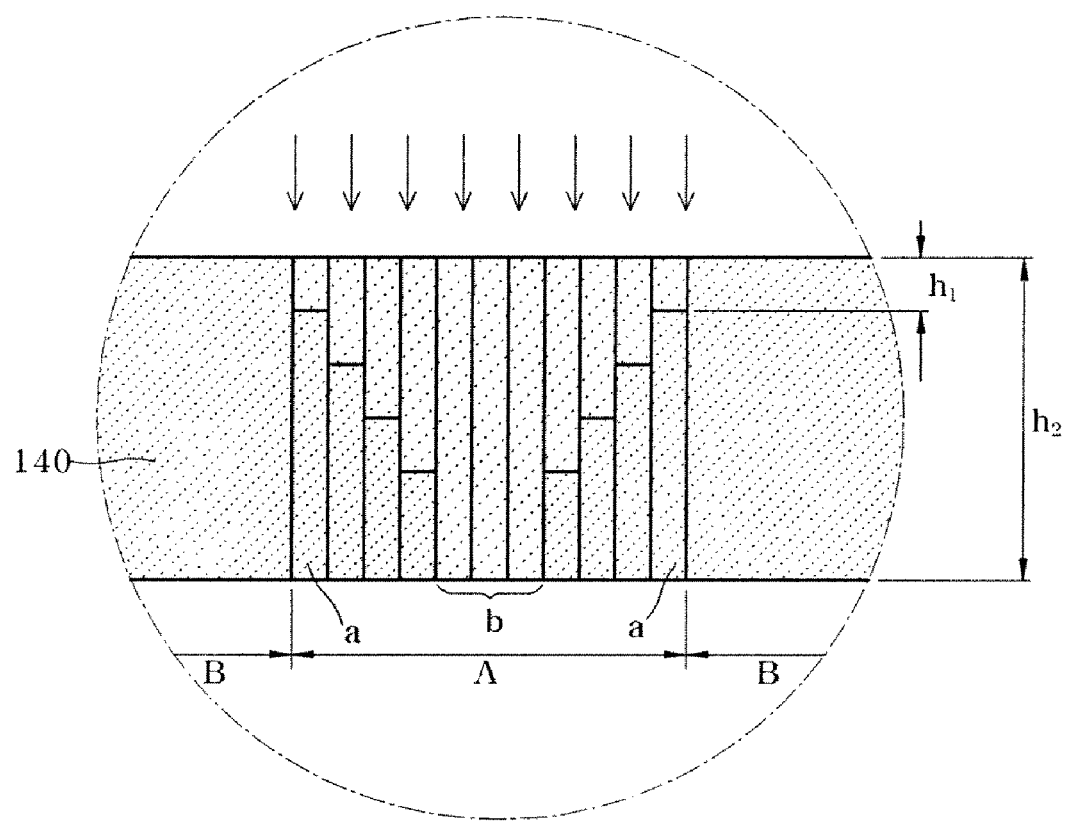

In one example, in a case that the exposure region A in the resist layer 140 has 11 split regions, the exposure region A in the resist layer 140 is divided into 11 split regions as illustrated in FIG. 3B. The electron beam exposure apparatus is set so that the electron beam is irradiated to the boundary between the exposure region A and the non-exposure region B, e.g. the outermost split regions a, with an intensity of 20% and is irradiated with intensities of 40%, 60%, 80%, and 100%, respectively, from the outermost split region a to the central split regions b, and then performs the irradiation of the electron beam. Then, the dose implanted into the outermost split regions a irradiated by the electron beam with the intensity of 20% is implanted to a predetermined depth h1 from the upper surface of the resist layer, and the dose implanted into the central split regions b irradiated by the electron beam with the intensity of 100% is implanted to a depth h2, i.e. the boundary between the absorber layer 130 and the resist layer 140. In other words, while the electron beam is irradiated to the central split region b to the depth corresponding to the thickness of the resist layer 140, the electron beam is irradiated to the outermost split region a only by the predetermined depth h1 and is not irradiated deeper than the predetermined depth h1. As such, since the depth into which the electron beam is irradiated is varied as the intensity of the electron beam irradiated to the resist layer 140, it is possible to control, by the split regions, the portion irradiated by the electron beam and the portion not irradiated by the electron beam.

Figure 4A:
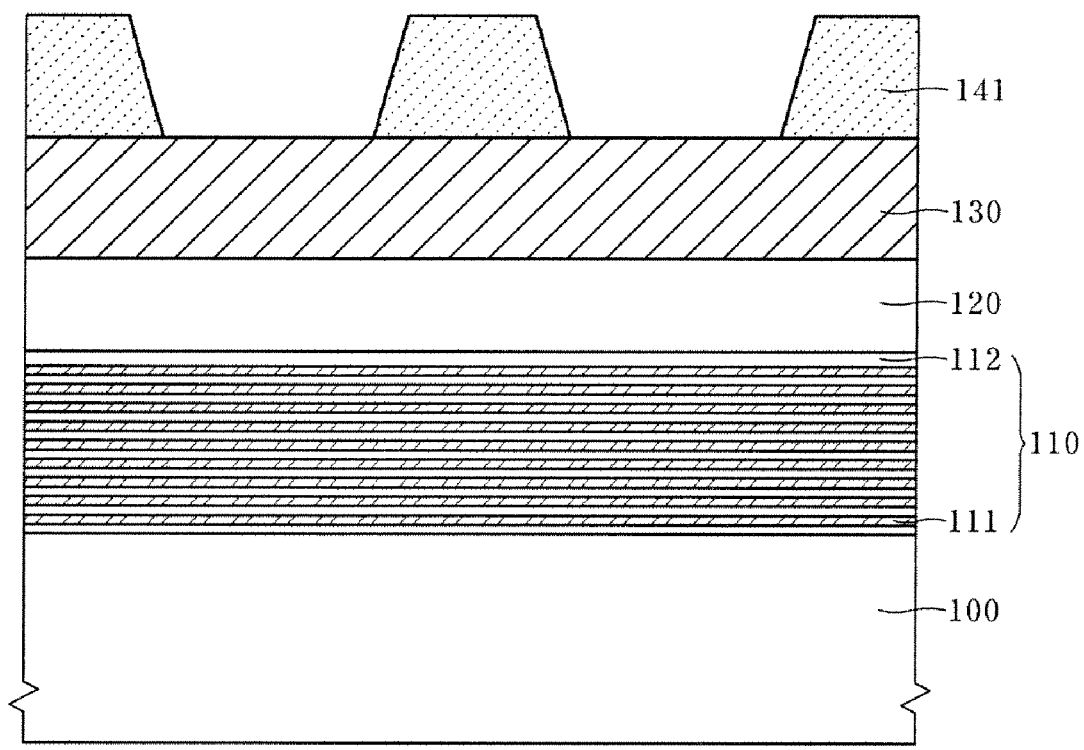

Referring to FIG. 4A, a development process using a developing solution is performed on the resist layer (140 in FIG. 3) irradiated by the electron beam. Then, the resist layer pattern 141 is formed in a trapezoid shape with a slanted side wall profile of which thickness is gradually decreased from the boundary between the exposure region and the non-exposure region toward the outside of the side wall.

Specifically, the developing solution is supplied to the resist layer 140 irradiated by the electron beam. Then, the portion irradiated by the electron beam is selectively dissolved and removed due to a solubility difference between the portion irradiated by the electron beam and the portion not irradiated by the electron beam. Since the thickness irradiated by the electron beam is different by the split regions, the amount removed by the developing solution is different by the split regions and thus the remaining thickness is different by the split regions.

Figure 4B:
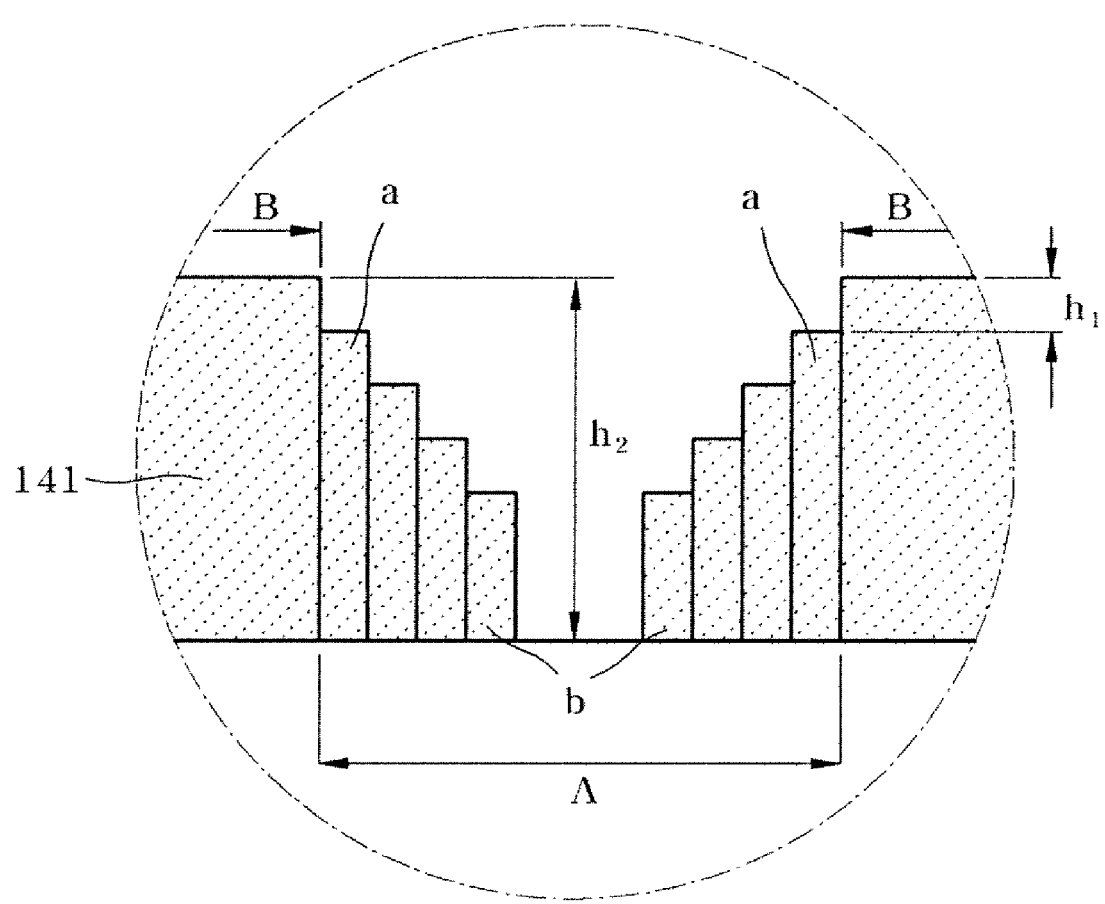

For example, describing in detail the resist layer pattern 141 with a trapezoid shape shown in FIG. 4B, in the outermost split region a irradiated by the electron beam with the intensity of 20%, the resist layer 140 at the outermost split region a is removed by the depth h1 into which the dose is implanted by the electron beam and the portion into which the dose is not implanted is remained. On the other hand, the resist layer 140 at the central split region b is entirely removed by the implanted dose to the depth h2 which is the boundary between the absorber layer 130 and the resist layer 140, and selectively exposes the absorber layer 130. Accordingly, it is possible to control the thickness of the resist layer against exposure to the developing solution by irradiating the electron beam with different intensities in the respective split regions. As such, it is possible to form the resist layer pattern 141 having a trapezoid shape with a slanted side wall profile of which thickness gradually decreases, and width is gradually increased from the boundary between the exposure region and the non-exposure region toward the outside of the side wall, by splitting the region to which the electron beam is irradiated into a plurality of split regions and then irradiating the electron beam with different intensities to the respective split regions to control the thickness of the resist layer remaining after exposure to the developing solution.

Figure 5:
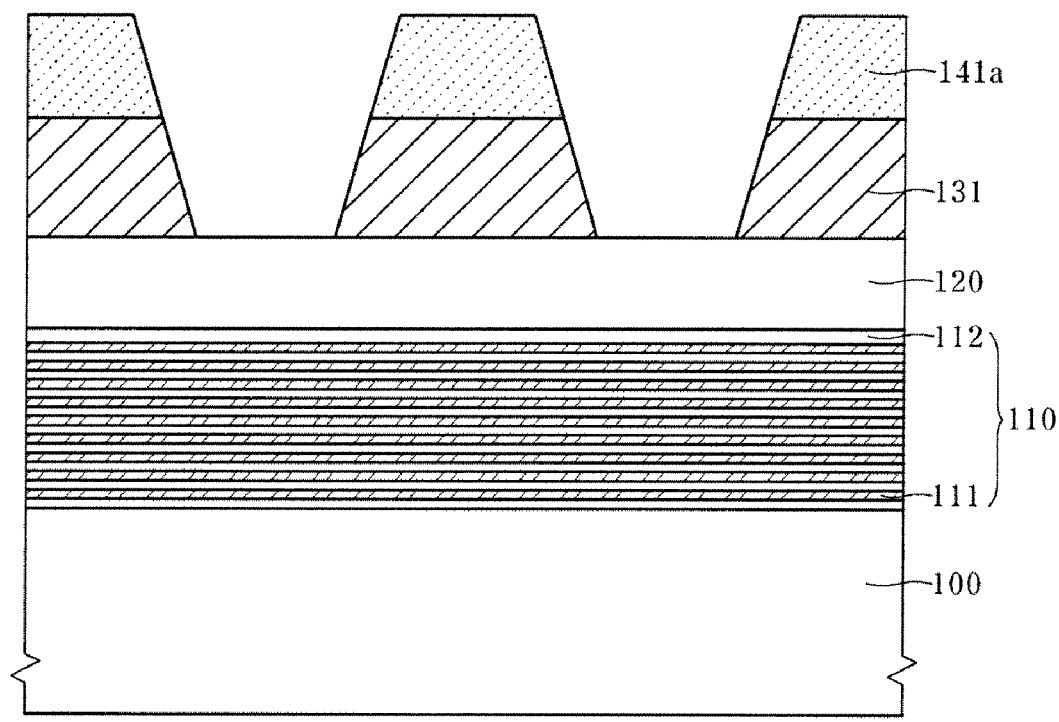

Referring to FIG. 5, an etching process is performed using the resist layer pattern 141 to form the absorber layer pattern 131 with a trapezoid shape. At this time, the absorber layer pattern 131 is formed having the same profile as the resist layer pattern depending on the removed thickness of the absorber layer 130 and the removed thickness of the resist layer pattern according to the time of the etching process. In other words, the absorber layer pattern 131 is formed in a trapezoid shape with a slanted side wall profile of which thickness is gradually decreased, and width is gradually increased toward the outside thereof.

Specifically, the portion exposed by the resist layer pattern, i.e. the portion of the absorber layer exposed by the central split region b and the resist layer pattern 141 is also removed by a predetermined thickness at the same time. As the portion of the absorber layer exposed by the central split region b is etched, the portion of the resist layer having relatively small thickness, for example, irradiated with the electron beam intensity of 80% is removed together to expose some portion of the absorber layer 130. Also, from the time, the exposed portion of the absorber layer 130 is also etched and removed by the etching process. Therefore, the portion of the absorber layer exposed by the resist layer pattern 141 is sequentially exposed according to the depth into which the dose is implanted, and the sequentially exposed portion of the absorber layer is also sequentially etched.

As such, when the absorber layer is etched, it is possible to form the absorber layer pattern 131 having the same side wall profile as the resist layer pattern 141 since the exposed portion of the absorber layer is enlarged with time difference and the absorber is exposed and etched with different starting times.

As is apparent from the above description, the absorber layer pattern 131 formed in a trapezoid shape with a slanted side wall profile of which the thickness gradually decreases, and width is gradually increased toward the outside thereof can inhibit the shadow effect caused by the inclined irradiation of the EUV light and thus can prevent the shift phenomenon in which a position of the wafer pattern is changed. Also, by varying the number of the split regions and irradiating the electron beam with different intensities to the exposure regions corresponding to the wafer field region, it is possible to form an absorber layer pattern which is asymmetric with respect to the exposure regions. Therefore, it is possible to effectively deal with the shadow effect resulting from the wafer field regions.

While the invention has been described with respect to the specific embodiments, various changes and modifications may be made without departing from the spirit and scope of the invention as defined in the following claims.

What is claimed is:

1. A method for fabricating an extreme ultraviolet (EUV) lithography mask, comprising:
    forming a reflecting layer, an absorber layer, and a resist layer sequentially over a substrate;
    defining an exposure region and a non-exposure region of the resist layer;
    defining a plurality of split regions by partially splitting the exposure region with regular spacing;
    performing an exposure process on the exposure region by irradiating an electron beam, wherein the intensity of the electron beam is increased from an outermost split region to a central split region, whereby the irradiated electron beam have different reaching depth on the respective split region;
    forming a resist layer pattern that has a slanted side wall profile by performing a development process to remove the portions of the resist layer, wherein an amount removed by a developing solution is different by the split regions and thus the remaining thickness is different by the split regions; and forming an absorber layer pattern with a slanted side wall profile by sequentially etching the portion of the absorber layer exposed by the resist layer pattern.

2. The method of claim 1, comprising forming the reflecting layer by repeatedly stacking double layers, each double layer comprising a molybdenum layer and a silicon layer.

3. The method of claim 1, wherein the absorber layer comprises a tantalum boron nitride (TaBN) layer and a tantalum boron oxide (TaBO) layer.

4. The method of claim 1, further comprising forming a buffer layer over the reflecting layer.

5. The method of claim 1, comprising irradiating the exposure region with the electron beam at a relative intensity of 20% at the boundary and at a relative intensity of 100% at the center of the exposure region.

6. The method of claim 1, comprising irradiating the exposure region with the electron beam to form the resist layer pattern in a trapezoid shape with a slanted side wall profile having a thickness which gradually decreases toward an outside of the side walls.

7. The method of claim 1, comprising forming the resist layer pattern in a trapezoid shape with a slanted side wall profile having a thickness which gradually decreases toward an outside of the side wall.

8. The method of claim 1, comprising forming the absorber layer pattern in a trapezoid shape with a slanted side wall profile having a thickness which gradually decreases toward an outside of the side wall.

* * * * *